(12) United States Patent
Zhang et al.

(10) Patent No.: US 7,042,290 B2
(45) Date of Patent: May 9, 2006

(54) OUTPUT STAGE CIRCUIT FOR AN OPERATIONAL AMPLIFIER

(75) Inventors: Joy Y. Zhang, Tucson, AZ (US); Rodney T. Burt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/664,311

(22) Filed: Sep. 16, 2003

(65) Prior Publication Data

US 2005/0057307 A1    Mar. 17, 2005

(51) Int. Cl.
*H03F 3/45*    (2006.01)
(52) U.S. Cl. ...................... 330/255; 330/253
(58) Field of Classification Search ............... 330/253, 330/254, 255, 257, 264, 265
See application file for complete search history.

(56) References Cited

U.S. PATENT DOCUMENTS

| | | | | |
|---|---|---|---|---|
| 3,631,357 A | * | 12/1971 | Hadley | 330/266 |
| 4,241,313 A | * | 12/1980 | Takehara | 330/253 |
| 4,987,381 A | * | 1/1991 | Butler | 330/255 |
| 6,316,999 B1 | * | 11/2001 | Kato | 330/255 |

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

An output stage circuit is configured for enabling an output of an amplifier circuit to be pulled upwards and/or downwards to or beyond an upper power supply or below a lower power supply. The exemplary output stage circuit comprises a pair of output transistors configured to provide an output voltage, and a controlled resistive circuit. The controlled resistive element is configured to enhance the gain of the output stage circuit by modifying the dynamic impedance effect of the upper output transistor during pull-up operation, or the lower output transistor during pull-down operation. During normal operation, the controlled resistive element operates with low resistance, e.g., acts as a "short," but during the pull-up or pull-down operation the controlled resistive element can be configured to add resistance to modify the dynamic impedance of the upper or lower output transistor. As a result, an amplifier circuit including an exemplary output stage circuit can swing towards or beyond an upper and/or lower power supply with minimal gain loss for the amplifier circuit, thus allowing for low voltage processes to be utilized.

32 Claims, 3 Drawing Sheets

OUTPUT STAGE CIRCUIT FOR AN OPERATIONAL AMPLIFIER

TECHNICAL FIELD

The present invention relates, generally, to amplifiers. More particularly, the present invention relates to an output stage circuit for an operational amplifier that can facilitate the pulling-up and/or pulling-down of the output of the operational amplifier towards or beyond an upper and/or lower power supply.

BACKGROUND OF THE INVENTION

In the efforts for optimizing and improving operation in various high-speed microcontroller-based devices, such as various instrumentation and measurement equipment and the like, significant attention has been given to the further improvement of the high-speed operational amplifiers utilized. For example, efforts have been made to improve transimpedance amplifiers that are used to convert low-level photodiode currents to usable voltage signals, and are commonly implemented within low-current and leakage current measurement applications, as well as other low-level sensor current applications.

Many operational amplifiers are being designed for improving not only the common mode rejection ratio (CMRR), noise and offset, but also the rail-to-rail performance. For example, operational amplifiers are desired with an output stage having full rail-to-rail output swing capability, such as in many transimpedance amplifier applications, e.g., from below zero volts or ground to above a full-scale voltage of $V_{DD}$. With reference to FIG. 1, an output stage 100 as may be implemented within a conventional operational amplifier having a class AB output configuration is illustrated. Output stage 100 comprises a pair of output transistors, $M_1$ and $M_2$, operating in a common-source configuration. Output transistors, $M_1$ and $M_2$ are typically configured as PMOS and NMOS devices, with PMOS output transistor $M_1$ having an input terminal, e.g., a source terminal, coupled to a supply voltage, and with NMOS output transistor $M_2$ having an input terminal, e.g., a source terminal, coupled to ground.

For most single supply operational amplifiers, difficulties arise when the output signal is pulled downwards to the lower output swing limit, such as to ground or below. Unfortunately, even the better amplifiers and output stages are only able to swing close to single supply ground, for example within approximately 10 mV, well short of the approximate 1 µV or less that is desired. Further, when output voltage at $V_{OUT}$ is close to zero volts or ground, output transistor $M_2$ will tend to operate within the deep triode region, acting effectively as a resistor, thus resulting in low gain complications, and thus slower speeds.

One method to improve the pulling downward of the output to ground or zero volts includes the addition of a pull-down resistor $R_{PD}$ coupled between output voltage $V_{out}$ and a negative voltage, e.g., ground less a voltage $V_{PD}$. Pull-down resistor $R_{PD}$ is configured to facilitate pulling down of output voltage $V_{OUT}$ towards or below the lower supply. However, pull-down resistor $R_{PD}$ does not address the lower gain characteristics caused by output transistor $M_2$ during pulling-down of output voltage $V_{OUT}$, output stage 100 still realizes reduced speed.

Other attempts to effectively pull output voltage $V_{OUT}$ downwards to or below the lower output supply, many operational amplifiers are configured with dual supply voltages instead of single supply voltages. However, such dual supply operational amplifiers generally require higher voltage processes than the low voltage processes utilized by single supply operational amplifiers.

SUMMARY OF THE INVENTION

In accordance with various aspects of the present invention, an output stage circuit is configured for enabling an output of an operational amplifier circuit to be pulled upwards and/or downwards to or beyond an upper or lower power supply with minimal loss of gain. The exemplary output stage circuit can be implemented within various operational amplifier configurations, including transimpedance amplifiers, or any other operational amplifier arrangement. In accordance with an exemplary embodiment, the output stage circuit comprises a pair of output transistors including an upper and lower output transistor configured to provide an output voltage, and a controlled resistive circuit configured to enhance the gain of the output stage circuit during the pulling upwards or downwards of the output voltage towards or beyond an upper or lower power supply with minimal gain loss being realized.

In accordance with one aspect of the present invention, the controlled resistive circuit is configured to modify the dynamic impedance effect of the upper output transistor during pull-up operation, or the lower output transistor during pull-down operation. For example, during normal operation, the controlled resistive circuit operates with low to approximately zero resistance, e.g., acts essentially as a "short," but during the pull-up or pull-down operation the controlled resistive element can be configured to add resistance to modify the dynamic impedance of the upper or lower output transistor. As a result, an operational amplifier circuit including an exemplary output stage circuit can swing towards or beyond the upper and/or lower power supply for the operational amplifier circuit with minimal loss of gain, thus allowing for low voltage processes to be utilized.

In accordance with an exemplary embodiment, an exemplary controlled resistive circuit comprises a controlled resistive element and an output sense element. The controlled resistive element can comprise various types of resistive elements, for example, variable resistors and/or transistor devices, for controlling the dynamic impedance of the lower output transistor. The output sense element is configured to sense the output voltage and provide level shifting of the appropriate voltage for operation of the controlled resistive element.

In accordance with another exemplary embodiment, the output stage circuit can comprise an exemplary output stage pull-up circuit including a controlled resistive element and an output sense element. In addition, the output stage circuit can be configured with both a pull-up circuit and a pull-down circuit, and can comprise both bipolar and MOS transistor devices.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

The present invention may be described herein in terms of various functional components. It should be appreciated that such functional components may be realized by any number of hardware or structural devices configured to perform the specified functions. For example, the present invention may employ various integrated components, e.g., buffers, supply references, current sources, signal conditioning devices and the like, comprised of various electrical devices, e.g., resistors, transistors, capacitors, diodes and other components whose values may be suitably configured for various intended purposes. In addition, the present invention may be practiced in any integrated circuit application where an output stage can be utilized. However for purposes of illustration only, exemplary embodiments of the present invention are illustrated herein in connection with an operational amplifier, for example one having a class AB output configuration. Further, it should be noted that while various components may be suitably coupled or connected to other components within exemplary circuits, such connections and couplings can be realized by direct connection between components, or by connection or coupling through other components and devices located thereinbetween.

As discussed above, prior art output stage circuits with single supply configurations have difficulty in pulling down the output sufficiently close to or below the lower output supply, e.g., to ground or below, instead approaching within approximately 10 mV of the lower supply. Relying on a pull-down resistor does not address the lower gain concerns caused by the resistive effects of the lower output transistor during the pulling-down of the output voltage, while dual supply configurations are also not desirable due to the high voltage processes that are required.

However, in accordance with various aspects of the present invention, an output stage circuit is configured for enabling an output of an amplifier circuit to be pulled upwards and/or downwards towards or beyond an upper or lower power supply, for example, to above $V_{DD}$ or below ground with minimal gain loss. The exemplary output stage circuit can be suitably implemented within various operational amplifier configurations, including transimpedance amplifiers, or any other operational amplifier arrangement.

Figure 1:
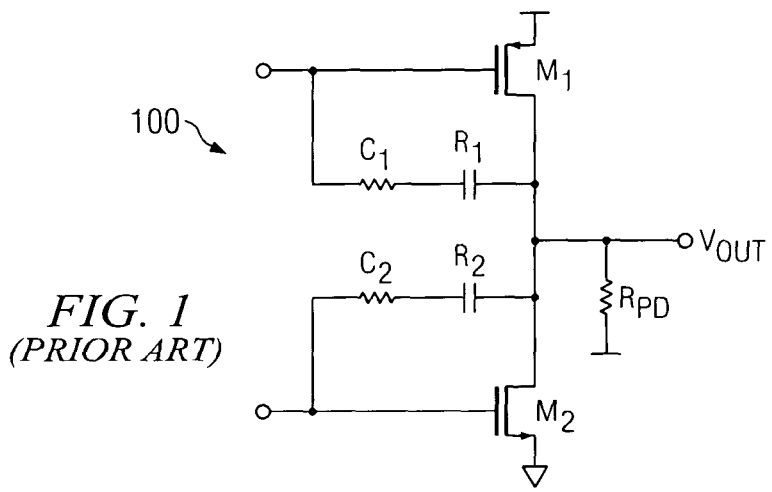
FIG. 1 illustrates a schematic diagram of a prior art output stage circuit.
Figure 2:
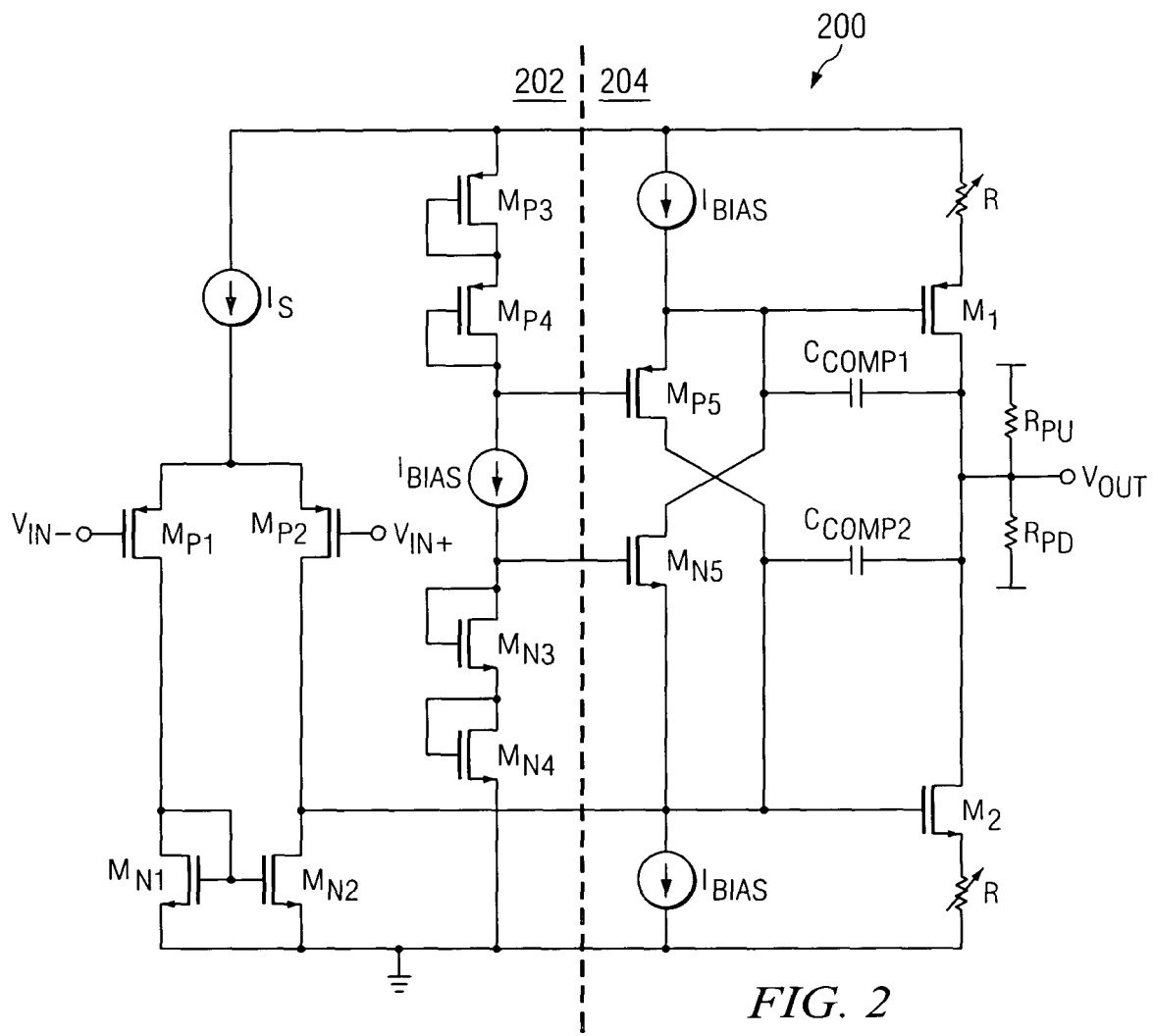
FIG. 2 illustrates an exemplary operational amplifier circuit having an output stage in accordance with an exemplary embodiment of the present invention.

With reference to an exemplary embodiment illustrated in FIG. 2, an exemplary operational amplifier circuit 200 comprises an input stage circuit 202 and an output stage circuit 204. In this exemplary embodiment, input stage circuit 202 comprises differential input terminals $V_{IN}+$ and $V_{IN}-$ configured from PMOS transistors $M_{P1}$ and $M_{P2}$, and a current mirror circuit comprising transistors $M_{N1}$ and $M_{N2}$ configured to provide an output signal to output stage circuit 204. Input stage circuit 202 can comprise any input stage configuration within an operational amplifier now known or hereinafter devised, and the configuration of input stage 202 is merely for illustrative purposes.

In accordance with this exemplary embodiment, operational amplifier 200 is configured in a class AB output arrangement with output stage circuit 204. Output stage circuit 204 comprises an upper output transistor $M_1$ and a lower output transistor $M_2$ configured to provide an output voltage at output terminal $V_{OUT}$, and a pull-up and/or pull-down circuit comprising pull-up and/or pull-down resistors $R_{PU}$ and $R_{PD}$ and one or more controlled resistive circuits R configured to enhance the gain of the output stage circuit during the pulling upwards and/or downwards of the output voltage towards or beyond an upper or lower power supply. As will be discussed in more detail below, while an exemplary output stage circuit 204 can be configured to provide either a pull-up and/or pull-down circuit, only one of the pull-up circuit or pull-down circuit are configured to operate at any one give time, i.e., an exemplary output stage circuit 204 can include both a pull-up circuit and a pull-down circuit, but will only allow operation of one of the circuits, with the other circuit being disabled or omitted.

While pull-up and pull-down resistors $R_{PU}$ and $R_{PD}$ can be configured internally within output stage circuit 200, in accordance with an exemplary embodiment, pull-up and pull-down resistors $R_{PU}$ and $R_{PD}$ are configured externally, thus allowing for modification and adjustment by an end user of output stage circuit 200. In addition, while FIG. 2 illustrates both pull-up and pull-down resistors $R_{PU}$ and $R_{PD}$ in the same circuit, in practical applications, only one of pull-up and pull-down resistors $R_{PU}$ and $R_{PD}$ are connected between output terminal $V_{OUT}$ and an upper or lower power supply. In accordance with other exemplary embodiments, both pull-up resistor $R_{PU}$ and pull-down resistor $R_{PD}$ can be included by coupling through switches to output terminal $V_{OUT}$, i.e., only one of pull-up resistor $R_{PU}$ and pull-down resistor $R_{PD}$ are connected through switches into the circuit and thus operating at one time.

Output stage circuit 204 can be configured in various arrangements. For example, with reference to FIG. 3A, an exemplary output stage circuit 300 as may be implemented within an operational amplifier, such as operational amplifier 200, is illustrated. Output stage circuit 300 comprises a pair of output transistors, $M_1$ and $M_2$, configured in a common-source arrangement, and a pull-down circuit comprising a pull-down resistor $R_{PD}$ and having a controlled resistive circuit R. Output transistors $M_1$ and $M_2$ comprise PMOS and NMOS devices, respectively, with an input terminal, i.e., source terminal, of transistor $M_1$ coupled to a supply voltage $V_{DD}$, an input terminal of output transistor $M_2$ coupled through controlled resistive circuit R to ground, and the common-drain terminals configured for providing an output terminal $V_{OUT}$.

Pull-down resistor $R_{PD}$ is coupled between output voltage $V_{OUT}$ and a negative supply voltage, e.g., ground less a voltage $V_{PD}$. In other words, the negative supply voltage comprises some voltage below ground. Pull-down resistor $R_{PD}$ is configured to facilitate pulling down of output voltage $V_{OUT}$ towards the lower negative supply. In accordance with an exemplary embodiment, pull-down resistor $R_{PD}$ is configured externally to the pull-down circuit, i.e., a discrete and separate component to output stage circuit 300, thus allowing lower voltage processes to be suitably utilized. However, pull-down resistor $R_{PD}$ can also comprise an integrated component, i.e., on-chip.

Pull-down resistor $R_{PD}$ can comprise various resistance values, such as between approximately 1 kohm or less to 5 kohms or more, e.g., an approximate 2 kohm resistor, with the value dependent upon amplifier design. For example, with the understanding that approximately ½ of the supply current will flow through output stage circuit 300, the value of resistance for pull-down resistor $R_{PD}$ can be calculated to enable the voltage drop across pull-down resistor $R_{PD}$ to be equal to negative supply voltage comprising ground less voltage $V_{PD}$.

In accordance with one aspect of the present invention, controlled resistive circuit R is configured to enhance the gain of output stage circuit 300 during the pulling downwards of the output voltage towards or beyond a lower power supply. To enhance the gain, controlled resistive circuit R is configured to modify the dynamic impedance effect of lower NMOS output transistor $M_2$ during pull-down operation. For example, during normal operation, controlled resistive circuit R is configured to operate with low to approximately zero resistance, e.g., act essentially as a "short," but during the pull-down operation the controlled resistive element adds resistance to modify the effect of the dynamic impedance of lower output transistor $M_2$. As a result, output transistor $M_2$ does not cause lower gains in the operational amplifier circuit. Accordingly, an operational amplifier circuit including an exemplary output stage circuit 300 can swing below lower power supply, e.g., below ground, with only a single supply voltage for operational amplifier circuit, thus allowing for low voltage processes to be utilized.

Figure 3A:
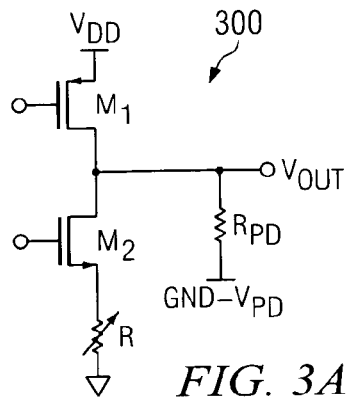
FIGS. 3A and 3B illustrate schematic diagrams of exemplary output stage pull-down and pull-up circuits in accordance with the present invention.
Figure 3B:
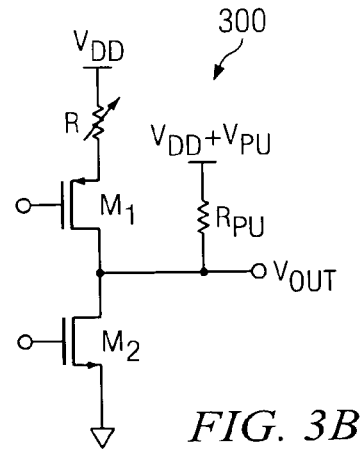

While controlled resistive circuit R is configured with output stage circuit 300 of FIG. 3A in a pull-down circuit arrangement, controlled resistive circuit R can also be configured in a pull-up circuit arrangement. For example, with reference to FIG. 3B, input terminal of output transistor $M_1$ is coupled through controlled resistive circuit R to the supply voltage. In accordance with this exemplary embodiment of the present invention, controlled resistive circuit R is configured to enhance the gain of output stage circuit 300 during the pulling upwards of the output voltage towards or beyond an upper power supply by modifying the dynamic impedance of upper output transistor $M_1$ during pull-up operation. For example, during normal operation, controlled resistive circuit R again operates with low to approximately zero resistance, e.g., acts essentially as a "short," but during the pull-up operation controlled resistive circuit R adds resistance to modify the effect of the dynamic impedance of upper output transistor $M_1$, thus preventing output transistor $M_1$ from reducing the gain of the operational amplifier during pull-up operation.

Moreover, an output stage circuit 300 can also be suitably configured with two controlled resistive circuits R. For example, with reference again to FIG. 2, an output stage circuit 200 can comprise a first controlled resistive circuit R configured to modify the dynamic impedance effect of upper output transistor $M_1$ during pull-up operation, and a second controlled resistive circuit R configured to modify the dynamic impedance effect of lower NMOS output transistor $M_2$ during pull-down operation. However, for an output stage circuit 200 having two controlled resistive circuits R, only one controlled resistive circuit R is operated at one time, i.e., while output stage circuit 200 can comprise a controlled resistive circuit R for pull-up operation and/or another controlled resistive circuit R for pull-down operation, only one controlled resistive circuit R is configured with a pull-up resistor $R_{PU}$ or pull-down resistor $R_{PD}$ for pull-up operation or pull-down operation at any one given time. Accordingly, an operational amplifier circuit including an exemplary output stage circuit can be configured to swing above the upper power supply and/or below the lower power supply with only a single supply voltage for the operational amplifier, thus allowing for low voltage processes to be utilized.

Controlled resistive circuit R can comprise various types of devices and circuits for modifying the dynamic impedance effect of upper and/or lower output transistors $M_1$ and $M_2$ during pull-up or pull-down operation. For example, controlled resistive circuit R can comprise variable resistor devices, sensing devices, numerous transistor devices or any other devices or circuits capable of providing controlled resistance and impedance conditions in an operational amplifier circuit.

Figure 4:
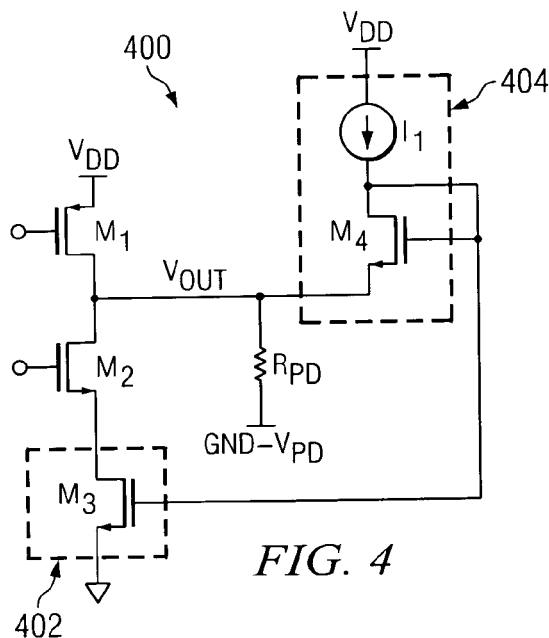
FIG. 4 illustrates a schematic diagram of another exemplary output stage pull-down circuit in accordance with an exemplary embodiment of the present invention.

For example, in accordance with an exemplary embodiment, with reference to FIG. 4, an exemplary output stage circuit 400 comprises upper and lower output transistors $M_1$ and $M_2$ and a pull-down circuit comprising pull-down resistor $R_{PD}$ and a controlled resistive circuit including a controlled resistive element 402 and an output sense element 404. Controlled resistive element 402 is configured to modify the dynamic impedance effect of lower NMOS output transistor $M_2$ during pull-down operation. In this exemplary embodiment, controlled resistive element 402 comprises an NMOS transistor $M_3$ coupled in series between output transistor $M_2$ and ground, e.g., the drain of transistor $M_3$ is coupled to the source of transistor $M_2$, and the source of transistor $M_3$ is coupled to ground. During normal operation, transistor $M_3$ is configured to operate within the triode region and have a very minimal resistance, e.g., operate essentially as a "short," and thus not affect the dynamic impedance of lower NMOS output transistor $M_2$. However, during pull-down operation, transistor $M_3$ suitably adds resistance to modify the dynamic impedance of lower output transistor $M_2$. Controlled resistive element 402 can comprise any element configured to modify the dynamic impedance effect of lower NMOS output transistor $M_2$ during pull-down operation, i.e., any variable resistive element in series with output transistor $M_2$.

Output sense element 404 is configured to sense output voltage $V_{OUT}$ and provide level shifting of the appropriate voltage for operation of controlled resistive element 402. In accordance with this exemplary embodiment, output sense element 404 comprises a current source $I_1$ coupled to supply voltage $V_{DD}$, and a diode-connected transistor $M_4$. Current source $I_1$ can comprise any current source configuration, e.g., a resistor or other transistor device coupled to supply voltage $V_{DD}$, or any other current source arrangement. Diode-connected transistor $M_4$ comprises an NMOS transistor having a source coupled to output voltage $V_{OUT}$ and a gate-drain connection coupled to a control terminal, e.g., a gate terminal, of transistor $M_3$.

During normal operation, such as when output voltage $V_{OUT}$ varies between 100 mV to less than supply voltage $V_{DD}$, diode-connected transistor $M_4$ operates to add a gate-source voltage $V_{GS}$ to control the gate of transistor $M_3$. During pull-down operation, when output voltage $V_{OUT}$ is to be pull downwards toward zero volts, diode-connected transistor $M_4$ provides only a minimal voltage drop. Thus, with the impedance of transistor $M_3$ coupled in series with the impedance of output transistor $M_2$, transistor $M_3$ adds another series of impedance to increase the effect of the dynamic resistance of output transistor $M_2$.

While an exemplary embodiment of output sense element 404 comprises current source $I_1$ coupled to supply voltage $V_{DD}$, and diode-connected transistor $M_4$, output sense element 404 can comprise any circuit configuration for sensing output voltage $V_{OUT}$ and provide control of operation for controlled resistive element 402, e.g., to provide level shifting of the appropriate voltage for the control terminal of NMOS transistor $M_3$.

Figure 6:
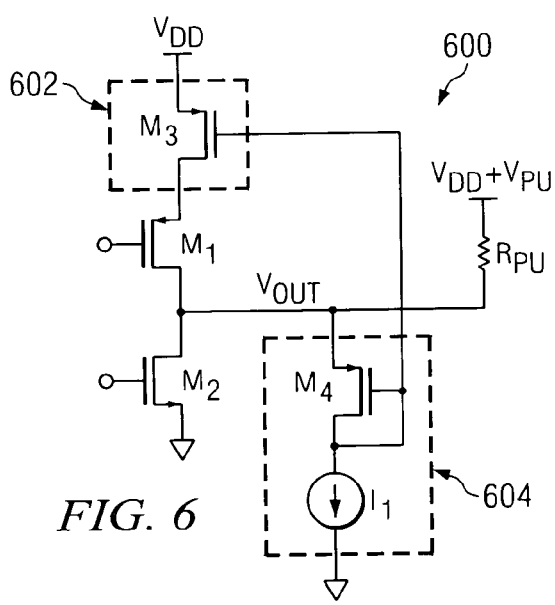
FIG. 6 illustrates a schematic diagram of an exemplary output stage pull-up circuit in accordance with an exemplary embodiment of the present invention.

As discussed above, while an output stage circuit can be configured in a pull-down circuit arrangement with a controlled resistive element, an exemplary output stage circuit can also be configured in a pull-up arrangement. For example, with reference to FIG. 6, in accordance with another exemplary embodiment, an output stage circuit 600 can comprise a pull-up circuit having a pull-up resistor $R_{PU}$ and a controlled resistive circuit including a controlled resistive element 602 and an output sense element 604. Pull-up resistor $R_{PU}$ is coupled between output voltage $V_{OUT}$ and supply voltage, $V_{DD}$, plus a voltage $V_{PU}$. Pull-up resistor $R_{PU}$ is configured to facilitate pulling up of output voltage $V_{OUT}$ towards the upper level supply.

Controlled resistive element 602 is configured to modify the dynamic impedance effect of upper PMOS output transistor $M_1$ during pull-up operation. Controlled resistive element 602 comprises an PMOS transistor $M_3$ coupled in series between output transistor $M_1$ and supply voltage $V_{DD}$, e.g., the drain of transistor $M_3$ is coupled to the source of transistor $M_1$, and the source of transistor $M_3$ is coupled to supply voltage $V_{DD}$. During normal operation, transistor $M_3$ is configured to operate within the triode region and have a very minimal resistance, i.e., operate as a "short," and thus not affect the dynamic impedance of upper PMOS output transistor $M_1$. However, during pull-up operation, transistor $M_3$ suitably adds resistance to modify the dynamic impedance of upper PMOS output transistor $M_1$, thus minimizing the potential gain loss caused by output transistor $M_1$. As a result, an operational amplifier circuit including an exemplary output stage circuit 600 can swing towards or beyond the upper power supply with minimal gain loss and only a single supply voltage for the operational amplifier circuit, thus allowing for low voltage processes to be utilized.

Output sense element 604 is configured to sense output voltage $V_{OUT}$ and provide level shifting of the appropriate voltage for operation of controlled resistive element 602, i.e., control of the voltage at the control terminal of transistor $M_3$. Output sense element 604 comprises a current source $I_1$ coupled to ground, and a diode-connected transistor $M_4$. Diode-connected transistor $M_4$ comprises a PMOS transistor having a source coupled to output voltage $V_{OUT}$ and a gate-drain connection coupled to the control terminal, e.g., a gate terminal, of transistor $M_3$. Diode-connected transistor $M_4$ is configured to operate similarly to that of diode-connected transistor $M_4$ of output sense element 404.

As discussed above, an exemplary output stage circuit can also be configured with both a pull-up circuit and a pull-down circuit arrangement, i.e., with both controlled resistive elements 402 and 602 and output sense elements 404 and 604, and can comprise both bipolar and MOS transistor devices.

Figure 5:
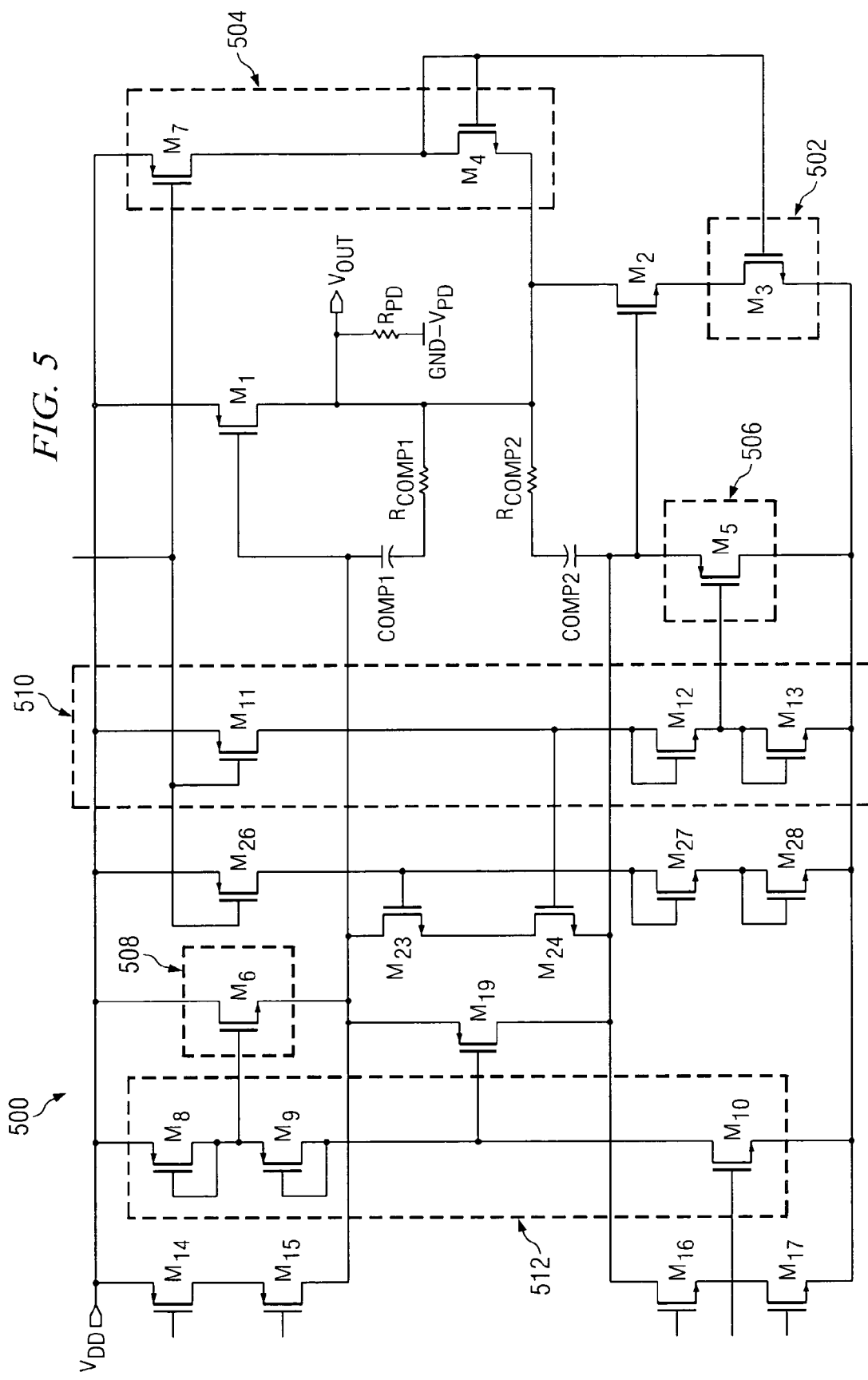
FIG. 5 illustrates a schematic diagram of another exemplary output stage pull-down circuit as may be configured within an exemplary operational amplifier circuit in accordance with an exemplary embodiment of the present invention.

With reference to FIG. 5, an exemplary embodiment of an output stage circuit 500 as can be implemented within an operational amplifier circuit is illustrated. Output stage circuit 500 can be configured with a class AB control loop and comprise a pair of output transistors $M_1$ and $M_2$ configured in a common-source arrangement, and a pull-down circuit having a controlled resistive element 502 and an output sense circuit 504. The class AB control loop comprises transistors $M_{19}$ and $M_{24}$ configured to control the gate terminals of output transistors $M_1$ and $M_2$. Output stage circuit 500 further comprises a diode branch 512 configured to provide a gate voltage for transistor $M_{19}$, and a diode branch 510 configured to provide a gate voltage for transistor $M_{24}$.

A transistor $M_{23}$ is provided in series with transistor $M_{24}$ to eliminate impact ionization effect within output stage circuit 500. Transistor $M_{26}$, and diodes $M_{27}$ and $M_{28}$ are configured to provide the gate voltage for control of transistor $M_{23}$. Output stage circuit 500 further includes current limit devices 506 and 508, comprising transistors $M_5$ and $M_6$, configured to limit current in either direction in output stage circuit 500 while the output is pulled towards either the upper or lower supply.

In this exemplary embodiment, controlled resistive element 502 comprises a transistor $M_3$, but can comprise any variable resistive circuit or device for modifying the dynamic impedance of lower output transistor $M_2$. Meanwhile, output sense element 504 comprises a diode-connected transistor $M_4$ and a current source comprising transistor $M_7$; however, output sense element can comprise any diode-configuration and any current source circuit configured to sense output voltage $V_{OUT}$ and provide level shifting of the appropriate voltage for operation of controlled resistive element 502. Although not illustrated in this embodiment, it should be noted that the exemplary output stage circuit could also comprise a pull-up circuit instead of, or in addition to, the pull-down circuit comprising controlled resistive element 502 and an output sense circuit 504, e.g., a controlled resistive element 602 and an output sense circuit 604 could be suitably configured with output transistor $M_1$. In addition, output stage circuit 500 can comprise various other devices and components, such as bias devices $M_{14}$–$M_{17}$, current sources or any other devices capable of use in output stage circuits.

In summary, an output stage circuit is configured for enabling an output of an amplifier circuit to be pulled upwards and/or downwards towards or beyond an upper or lower power supply, for example, to above $V_{DD}$ or below ground, with minimal gain loss. The exemplary output stage circuit can be implemented within various operational amplifier configurations. The output stage circuit can comprise a pair of output transistors configured to provide an output voltage, and a pull-up and/or pull-down circuit comprising a controlled resistive circuit configured to enhance the gain of an operational amplifier circuit during the pulling upwards and/or downwards of the output voltage towards or beyond an upper and/or lower power supply. An exemplary controlled resistive circuit comprises a controlled resistive element and an output sense element for modifying the dynamic impedance effect of the upper and/or lower output transistors during pull-up or pull-down operation, thus reducing the gain losses caused by the upper and/or lower output transistors.

The present invention has been described above with reference to various exemplary embodiments. However, various other changes and modifications may be made to the exemplary embodiments without departing from the scope of the present invention. In addition, any type of transistor devices configured for performing the intended functions can be utilized. These and other changes or modifications are intended to be included within the scope of the present invention, as set forth in the following claims.

The invention claimed is:

1. An output stage circuit configured for use with an operational amplifier circuit, said output stage circuit comprising:
   a pair of output transistors configured to provide an output voltage; and
   a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss,
   wherein said output stage comprises a pull-down resistor coupled between said output voltage and a negative supply, said pair of output transistors comprising an upper output transistor and a lower output transistor, said at least one controlled resistive element coupled between said lower output transistor and ground, said at least one controlled resistive element configured to modify said dynamic impedance of said lower output transistor during pull-down operation.

2. The output stage circuit according to claim 1, wherein said at least one controlled resistive element comprises a transistor having an output terminal coupled to an input terminal of said lower output transistor.

3. An output stage circuit configured for use with an operational amplifier circuit, said output stage circuit comprising:
   a pair of output transistors configured to provide an output voltage; and
   a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss,
   wherein said output stage comprises a pull-up resistor coupled between said output voltage and a positive supply, said pair of output transistors comprising an upper output transistor and a lower output transistor, said at least one controlled resistive element coupled between said upper output transistor and a supply voltage, said at least one controlled resistive element configured to modify said dynamic impedance of said upper output transistor during pull-up operation.

4. The output stage circuit according to claim 3, wherein said at least one controlled resistive element comprises a transistor having an output terminal coupled to an input terminal of said upper output transistor.

5. An output stage circuit configured for use with an operational amplifier circuit, said output stage circuit comprising:
   a pair of output transistors configured to provide an output voltage; and
   a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss,
   wherein said output stage circuit comprises:
   an upper output transistor and a lower output transistor;
   at least one of a pull-up resistor coupled between said output voltage and a positive supply, and a pull-down resistor coupled between said output voltage and a negative supply;
   a first controlled resistive element coupled between said lower output transistor and ground, said first controlled resistive element configured to modify said dynamic impedance of said lower output transistor during pull-down operation; and
   a second controlled resistive element coupled between said upper output transistor and a supply voltage, said second controlled resistive element configured to modify said dynamic impedance of said upper output transistor during pull-up operation.

6. An output stage circuit configured for use with an operational amplifier circuit, said output stage circuit comprising:
   a pair of output transistors configured to provide an output voltage; and
   a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss,
   wherein said controlled resistive circuit further comprises at least one output sense element configured to sense said output voltage and provide level shifting to an appropriate voltage for operation of said at least one controlled resistive element.

7. The output stage circuit according to claim 6, wherein said output sense element comprises a current source coupled to a supply voltage, and a diode-connected transistor coupled between said current source and said output voltage.

8. An output stage circuit configured for use with an operational amplifier circuit, said output stage circuit comprising:
   a pair of output transistors configured to provide an output voltage; and
   a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss,
   wherein said output stage circuit further comprises one of a pull-down resistor coupled between said output voltage and a negative supply voltage and a pull-up resistor coupled between said output voltage and a positive supply voltage.

9. An operational amplifier circuit for high-speed applications, said operational amplifier circuit comprising:
   an input stage circuit configured for receiving an input signal and providing an output signal;
   an output stage circuit comprising:
   a pair of output transistors configured to provide an output voltage; and
   a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss, wherein said output stage circuit comprises a pull-down resistor coupled between said output voltage and a negative supply, said pair of output transistors comprising an upper output transistor and a lower output transistor, said at least one controlled resistive element comprising a transistor having an output terminal coupled to an input terminal of said lower output transistor, said at least one controlled resistive element configured to modify said dynamic impedance of said lower output transistor during pull-down operation.

10. An operational amplifier circuit for high-speed applications, said operational amplifier circuit comprising:

an input stage circuit configured for receiving an input signal and providing an output signal;

an output stage circuit comprising:

a pair of output transistors configured to provide an output voltage; and a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss, wherein said output stage circuit comprises a pull-up resistor coupled between said output voltage and a positive supply, said pair of output transistors comprises an upper output transistor and a lower output transistor, said at least one controlled resistive element comprising a transistor having an output terminal coupled to an input terminal of said upper output transistor, said at least one controlled resistive element configured to modify said dynamic impedance of said upper output transistor during pull-up operation.

11. An operational amplifier circuit for high-speed applications, said operational amplifier circuit comprising:

an input stage circuit configured for receiving an input signal and providing an output signal;

an output stage circuit comprising:

a pair of output transistors configured to provide an output voltage; and a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss, wherein said output stage circuit comprises:

an upper output transistor and a lower output transistor;

at least one of a pull-up resistor coupled between said output voltage and a positive supply, and a pull-down resistor coupled between said output voltage and a negative supply;

a first controlled resistive element coupled between said lower output transistor and ground, said first controlled resistive element configured to modify said dynamic impedance of said lower output transistor during pull-down operation; and a second controlled resistive element coupled between said upper output transistor and a supply voltage, said second controlled resistive element configured to modify said dynamic impedance of said upper output transistor during pull-up operation.

12. An operational amplifier circuit for high-speed applications, said operational amplifier circuit comprising:

an input stage circuit configured for receiving an input signal and providing an output signal;

an output stage circuit comprising:

a pair of output transistors configured to provide an output voltage; and a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss, wherein said controlled resistive circuit further comprises at least one output sense element configured to sense said output voltage and provide level shifting to an appropriate voltage for operation of said at least one controlled resistive element.

13. The operational amplifier circuit according to claim 12, wherein said at least one output sense element comprises a current source coupled to a supply voltage, and a diode-connected transistor coupled between said current source and said output voltage.

14. An operational amplifier circuit for high-speed applications, said operational amplifier circuit comprising:

an input stage circuit configured for receiving an input signal and providing an output signal;

an output stage circuit comprising:

a pair of output transistors configured to provide an output voltage; and a controlled resistive circuit comprising at least one controlled resistive element coupled to at least one of said pair of output transistors, said at least one controlled resistive element configured to modify a dynamic impedance of said at least one of said pair of output transistors to facilitate output swing of said output stage circuit with minimal gain loss, wherein said output stage circuit further comprises one of a pull-down resistor coupled between said output voltage and a negative supply voltage and a pull-up resistor coupled between said output voltage and a positive supply voltage.

15. A method for facilitating output swing in an output stage circuit of an amplifier, said method comprising the steps of:

sensing an output voltage provided by said output stage circuit to determine whether said output voltage is approaching one of a positive power supply and a negative power supply;

modifying a dynamic impedance effect of at least one output transistor of said output stage circuit when said output stage circuit approaches said one of an upper power supply and a lower power supply, wherein said step of sensing said output voltage comprises using an output sense element to sense said output voltage and to provide level shifting to an appropriate voltage for operation of said controlled resistive element.

16. The method according to claim 15, wherein said step of modifying said dynamic impedance effect comprises using said controlled resistive element comprising a transistor coupled between ground and a lower output transistor to add resistance to modify said dynamic impedance effect of said lower output transistor during pull-down operation.

17. The method according to claim 16, wherein said step of modifying said dynamic impedance effect further comprises using a pull-down resistor coupled between said output voltage and a negative supply voltage to facilitate pull-down operation.

18. An output stage circuit configured for use with an operational amplifier circuit, said output stage circuit comprising:
   a pair of output transistors configured to provide an output voltage, said pair of output transistors comprising an upper output transistor and a lower output transistor;
   at least one of a pull-up resistor coupled between said output voltage and a positive supply, and a pull-down resistor coupled between said output voltage and a negative supply;
   a controlled resistive circuit comprising:
   at least one controlled resistive element coupled to at least one of said upper output transistor and said lower output transistor, said at least one controlled resistive element configured to enhance gain of said output stage circuit during at least one of a pull-up operation and a pull-down operation; and
   at least one output sense element configured to sense said output voltage and provide a control voltage for operation of said at least one controlled resistive element.

19. The output stage circuit according to claim 18, wherein said at least one controlled resistive element is configured to modify a dynamic impedance of said at least one of said upper output transistor and said lower output transistor during at least one of a pull-up operation and a pull-down operation of said output stage circuit.

20. The output stage circuit according to claim 18, wherein said output stage comprises a pull-down resistor coupled between said output voltage and said negative supply, said at least one controlled resistive element coupled between said lower output transistor and ground and configured to modify said dynamic impedance of said lower output transistor during pull-down operation, said at least one controlled resistive element comprises a transistor having an output terminal coupled to an input terminal of said lower output transistor.

21. The output stage circuit according to claim 18, wherein said output stage comprises a pull-up resistor coupled between said output voltage and a positive supply, said at least one controlled resistive element coupled between said upper output transistor and a supply voltage and configured to modify said dynamic impedance of said upper output transistor during pull-up operation, said at least one controlled resistive element comprises a transistor having an output terminal coupled to an input terminal of said upper output transistor.

22. The output stage circuit according to claim 18, wherein said output stage circuit comprises:
   both said pull-up resistor configured for pull-up operation and said pull-down resistor configured for pull-down operation, said pull-up resistor and said pull-down resistor being coupled through switches to said output voltage;
   a first controlled resistive element coupled between said lower output transistor and ground, said first controlled resistive element configured to enhance gain of said output stage circuit during pull-down operation;
   a first output sense element configured to sense said output voltage and provide a control voltage for operation of said first controlled resistive element;
   a second controlled resistive element coupled between said upper output transistor and a supply voltage, said second controlled resistive element configured to enhance gain of said output stage circuit during pull-up operation; and
   a second output sense element configured to sense said output voltage and provide a control voltage for operation of said second controlled resistive element.

23. The output stage circuit according to claim 18, wherein said at least one output sense element comprises a current source coupled to a supply voltage, and a diode-connected transistor coupled between said current source and said output voltage, said current source and a gate-drain connection of said at least one output sense element being coupled to a control terminal of said at least one controlled resistive element.

24. An output stage circuit configured for use with an operational amplifier circuit, said output stage circuit comprising:
   an upper output transistor and a lower output transistor configured to provide an output voltage;
   a pull-down circuit configured for pull-down operation of said output circuit, said pull-down circuit comprising:
   a pull-down resistor coupled between said output voltage and a negative supply;
   a controlled resistive element coupled to said lower output transistor and configured to enhance gain of said output stage circuit during pull-down operation; and
   an output sense element configured to sense said output voltage and provide a control voltage for operation of said controlled resistive element.

25. The output stage circuit according to claim 24, wherein said controlled resistive element is configured to modify a dynamic impedance of said lower output transistor during pull-down operation of said output stage circuit.

26. The output stage circuit according to claim 24, wherein said controlled resistive element comprises a transistor having an output terminal coupled to an input terminal of said lower output transistor.

27. The output stage circuit according to claim 24, wherein said output sense element comprises a current source coupled to a supply voltage, and a diode-connected transistor coupled between said current source and said output voltage, said current source and a gate-drain connection of said output sense element being coupled to a control terminal of said controlled resistive element.

28. The output stage circuit according to claim 24, wherein said output stage circuit further comprises a pull-up circuit configured for pull-up operation of said output circuit, said pull-up circuit comprising:
   a pull-up resistor coupled through a switch between said output voltage and a positive supply;
   a second controlled resistive element coupled to said upper output transistor and configured to enhance gain of said output stage circuit during said pull-up operation; and
   a second output sense element configured to sense said output voltage and provide a control voltage for operation of said second controlled resistive element.

29. A method for facilitating pull-down operation in an output stage circuit of an operational amplifier, said method comprising the steps of:
   sensing with an output sense element an output voltage provided by said output stage circuit to determine whether said output voltage is being pulled downwards to a lower power supply comprising approximately ground;

adding a resistance through a controlled resistive element to a lower output transistor of said output stage circuit when said output voltage is being pulled downwards to said lower power supply; and reducing gain loss of said output stage circuit caused by said lower output transistor, wherein said step of sensing with said output sense element said output voltage further comprises providing level shifting to an appropriate voltage for operation of said controlled resistive element.

30. The method according to claim 29, wherein said step of adding a resistance results in modifying of a dynamic impedance effect of said lower output transistor.

31. The method according to claim 29, wherein said method further comprises the step of controlling said controlled resistive element to provide an approximately zero resistance during normal operation, and with increased resistance when said output voltage is being pulled downwards to said lower power supply.

32. The method according to claim 29, wherein said step of modifying said dynamic impedance effect further comprises using a pull-down resistor coupled between said output voltage and a negative supply voltage to facilitate pull-down operation.

* * * * *